United States Patent [19]

Nishihara

[11] Patent Number: 5,371,398

[45] Date of Patent: Dec. 6, 1994

[54] THIN FILM TRANSISTOR

[75] Inventor: Yoshio Nishihara, Kanagawa, Japan

[73] Assignee: Fuji Xerox Co., Ltd., Tokyo, Japan

[21] Appl. No.: 10,471

[22] Filed: Jan. 28, 1993

Related U.S. Application Data

[63] Continuation of Ser. No. 423,334, Oct. 19, 1989, abandoned.

[30] Foreign Application Priority Data

Oct. 19, 1988 [JP] Japan .................. 63-261354

[51] Int. Cl.$^5$ ............... H01L 27/01; H01L 27/13; H01L 29/78
[52] U.S. Cl. .................... 257/435; 257/57; 257/61; 257/72
[58] Field of Search ............ 357/30 R, 30 I, 30 P, 357/4, 2, 23.7; 250/208.1, 215; 359/57, 58, 59; 257/57, 66, 72, 443, 444, 448, 61, 435

[56] References Cited

U.S. PATENT DOCUMENTS

| | | | |
|---|---|---|---|
| 4,678,282 | 7/1987 | Yaniv et al. | 350/334 |
| 4,680,085 | 7/1987 | Vijan et al. | 156/643 |
| 4,698,494 | 10/1987 | Kato et al. | 250/211 |
| 4,885,616 | 12/1989 | Ohta | 357/23.7 |
| 4,889,983 | 12/1989 | Numano et al. | 250/211 |

FOREIGN PATENT DOCUMENTS

| | | | |
|---|---|---|---|
| 59-163871 | 9/1984 | Japan | 357/4 |
| 60-83370 | 5/1985 | Japan | 257/66 |
| 60-182169 | 9/1985 | Japan | 257/57 |
| 61-32471 | 2/1986 | Japan | 357/4 |
| 61-292972 | 12/1986 | Japan | 257/53 |
| 62-219963 | 9/1987 | Japan | 357/30 |
| 62-245672 | 10/1987 | Japan | 257/61 |
| 63-199458 | 8/1988 | Japan | 357/30 |

Primary Examiner—Jerome Jackson
Assistant Examiner—Donald L. Monin, Jr.
Attorney, Agent, or Firm—Finnegan, Henderson, Farabow, Garrett & Dunner

[57] ABSTRACT

A thin film transistor comprising a gate electrode of electrically conductive material, a semiconducting material, a gate insulating material located between the gate electrode and the semiconducting material, a source electrode of electrically conductive material adjacent to the semiconducting material, a drain electrode of electrically conductive material adjacent to the semiconducting material, and a light intercepting material for preventing the incidence of light on the semiconducting material wherein the light interrupting material layer is formed of the same electrically conductive material as the source electrode and the drain electrode.

14 Claims, 6 Drawing Sheets

THIN FILM TRANSISTOR

This application is a continuation of application Ser. No. 07/423,334 filed Oct. 19, 1989, now abandoned.

BACKGROUND OF THE INVENTION

1. Field of the Invention

This invention relates to a thin film transistor for use in driving an image sensor, an electroluminescence display, a liquid crystal display or the like; and more particularly to a method for fabricating a thin film transistor provided with a light intercepting layer for preventing the incidence of light on a semiconductor layer.

2. Related Art

FIGS. 7 and 8 show conventional thin film transistors in which the main part is comprised of a glass substrate (a), a gate electrode (b) formed on the glass substrate (a), a gate insulating film (c) for covering this gate electrode (b), and a semiconductor layer (d) deposited on the gate insulating film. A protecting film (e) is provided at a portion corresponding to the gate electrode (b) on this semiconductor layer (d) as necessary for protecting the semiconductor layer (d). Another semiconductor layer (f) is formed on the semiconductor layer (d) which is mixed with bivalent or trivalent atoms for forming an ohmic contact. A source electrode (g) and a drain electrode (h) are electrically connected to the semiconductor layer (f). A diffusion preventing layer (j) is disposed between the source and drain electrodes (g) and (h) and the semiconductor layer (f) for preventing the diffusion of metal composing the source and drain electrodes (g) and (h), as shown in FIGS. 7 and 8.

Further, a voltage ($V_D$) is applied across the source and drain electrodes (g) and (h) and also a gate voltage ($V_g$) is applied to the gate electrode (b). Thereby, a channel is formed in the semiconductor layer (d), and the transistor falls into an ON-state. In contrast, by reducing the gate voltage ($V_g$), no channel is formed in the semiconductor layer (d) and the transistor falls into an OFF-state. Such a transistor is used for driving the above described image sensor, electroluminescence display, liquid crystal display, or the like.

In the thin film transistor of this type, a channel is formed in the semiconductor layer (d) even when light is incident on the semiconductor layer (d). Thus, such a transistor can fall into an ON-state in spite of the drop of the gate voltage ($V_g$).

Therefore, the prior art employs a method for preventing the incidence of light on the semiconductor layer (d) by forming a light intercepting layer (k) made of a black resin (for example, a silicon resin containing carbon) on the top side of the thin film transistor.

There is, however, a problem in the prior art that the light intercepting action of the light intercepting layer (k) is not sufficiently effective so that where the thin film transistor is applied for driving of a device serving as an image sensor for example, the surface of the transistor can be irradiated by intensive light. Thus, part of the light can be incident on the semiconductor layer (d) whereby the transistor is constantly in an ON-state and thus the device does not function as an image sensor.

Further, there is another problem in the prior art that the number of steps for fabricating the conventional thin film transistor becomes large because of the fact that in fabricating the conventional thin film transistor, it is necessary to form the light intercepting layer (k) on the surfaces of the source and drain electrodes (g) and (h) after the electrodes are formed.

SUMMARY OF THE INVENTION

The present invention is accomplished in view of the above problems of the prior art, and it is therefore an object of the present invention to provide a thin film transistor which avoids the incidence of light on the semiconductor layer. It is a further object of the present invention to provide a method for fabricating such a transistor which comprises a small number of steps.

In accordance with the present invention, there is provided a a thin film transistor comprising a gate electrode of electrically conductive material, a semiconducting material, a gate insulating material located between said gate electrode and the semiconducting material, a source electrode of electrically conductive material adjacent to the semiconducting material, a drain electrode of electrically conductive material adjacent to the semiconducting material, and a light intercepting material for preventing the incidence of light on the semiconducting material wherein the light intercepting material layer is formed of the same electrically conductive material as the source electrode and the drain electrode.

In accordance with the present invention, there is further provided a method for forming a thin film transistor comprising the steps of forming a gate electrode on an insulating substrate, forming a gate insulating film on the gate electrode, forming a semiconductor layer on the gate electrode, forming an insulating layer by laminating the insulating layer on a semiconductor layer, forming a metal layer on the surface of the insulating layer, and removing selectively a portion of the metal layer to form a source electrode, a drain electrode, and a light intercepting layer.

By the above described technical means, the present invention can prevent the incidence of light on the semiconductor layer because the light intercepting layer is formed with a metal layer and also can reduce the number of fabrication steps because in the metal removing step, the source and drain electrodes and the light intercepting layer are formed by partially removing the metal layer.

DESCRIPTION OF THE PREFERRED EMBODIMENTS

Figure 1:
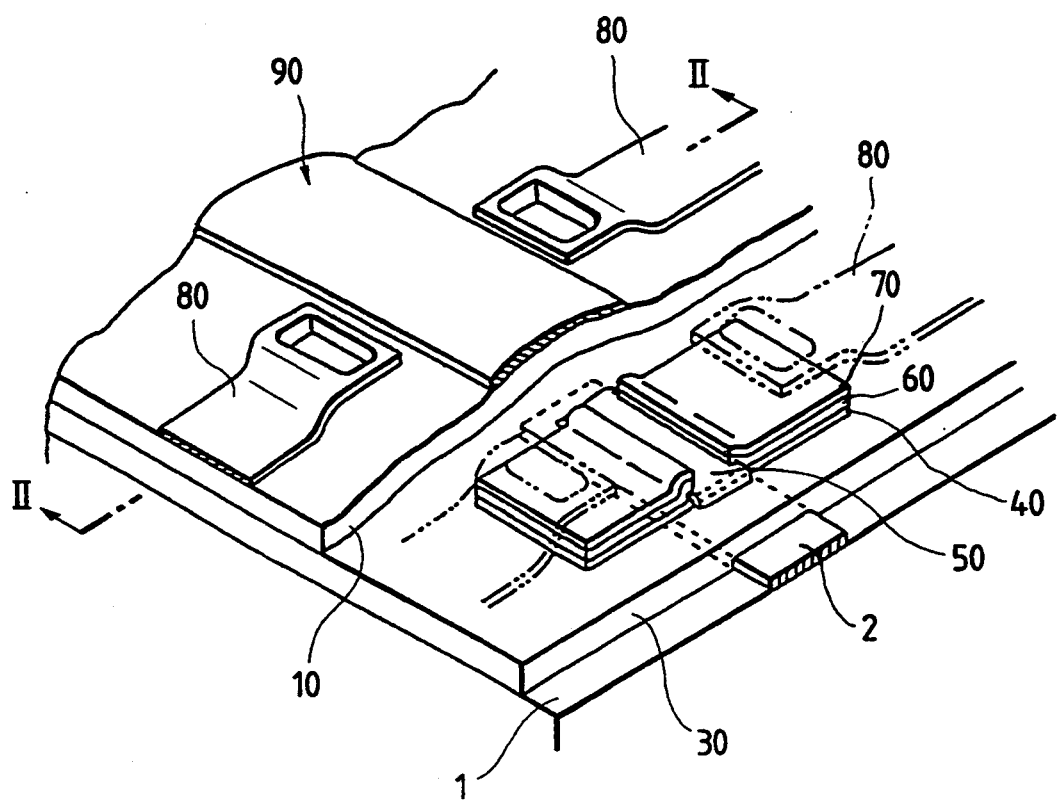
FIG. 1 is a perspective illustration for showing the construction of a thin film transistor fabricated by a method embodying the present invention.
Figure 2:
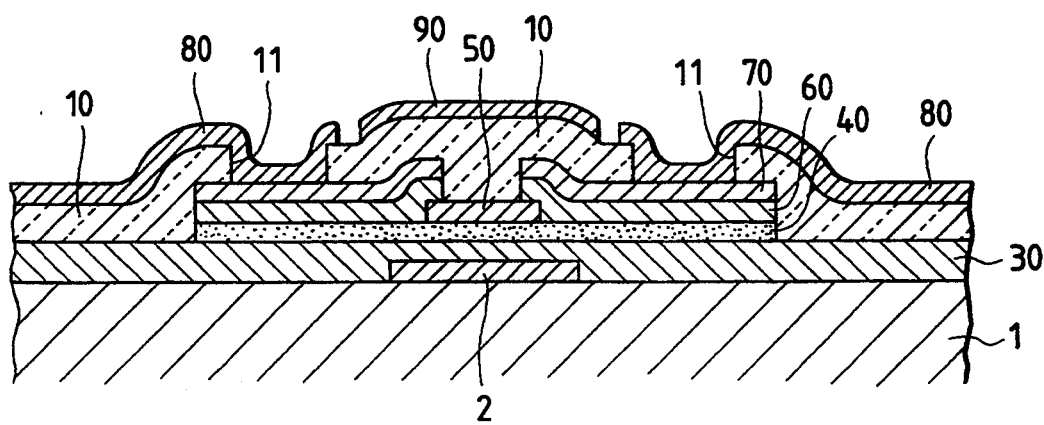
FIG. 2 is a cross sectional view taken on line II—II of FIG. 1.

Hereinafter, an embodiment of the present invention will be described in detail by referring to the drawings. A thin film transistor of this embodiment has a main part which comprises, as shown in FIGS. 1 and 2, a transparent glass 1, a gate insulating film 30 covering a gate electrode 2. A first amorphous semiconductor layer 40 is deposited on the gate insulating film 30, and a protecting film 50 is provided on a portion corresponding to the gate electrode 2 on this first amorphous semiconductor layer 40 for protecting the first amorphous semiconductor layer 40.

A second amorphous semiconductor layer 60 is formed on the first amorphous semiconductor layer 40 and is mixed with quintvalent atoms for forming an ohmic contact. A diffusion preventing layer 70 is provided on the second amorphous semiconductor layer 60 for preventing diffusion of metal material composing the source and drain electrodes 80 to the second amorphous semiconductor layer 60. An insulating layer 10 is deposited on the diffusion preventing layer 70 and protection layer 50 and having apertures 11 at a portion corresponding to the diffusion preventing layer 70. The source and drain electrodes 80 and 80 are connected to the diffusion preventing layer 70 through the apertures of the insulating layer 10, and a light intercepting layer 90 is laminated on the insulating layer 10 and grounded at one end thereof for preventing the incidence of light on the semiconductor layer.

Figure 3:
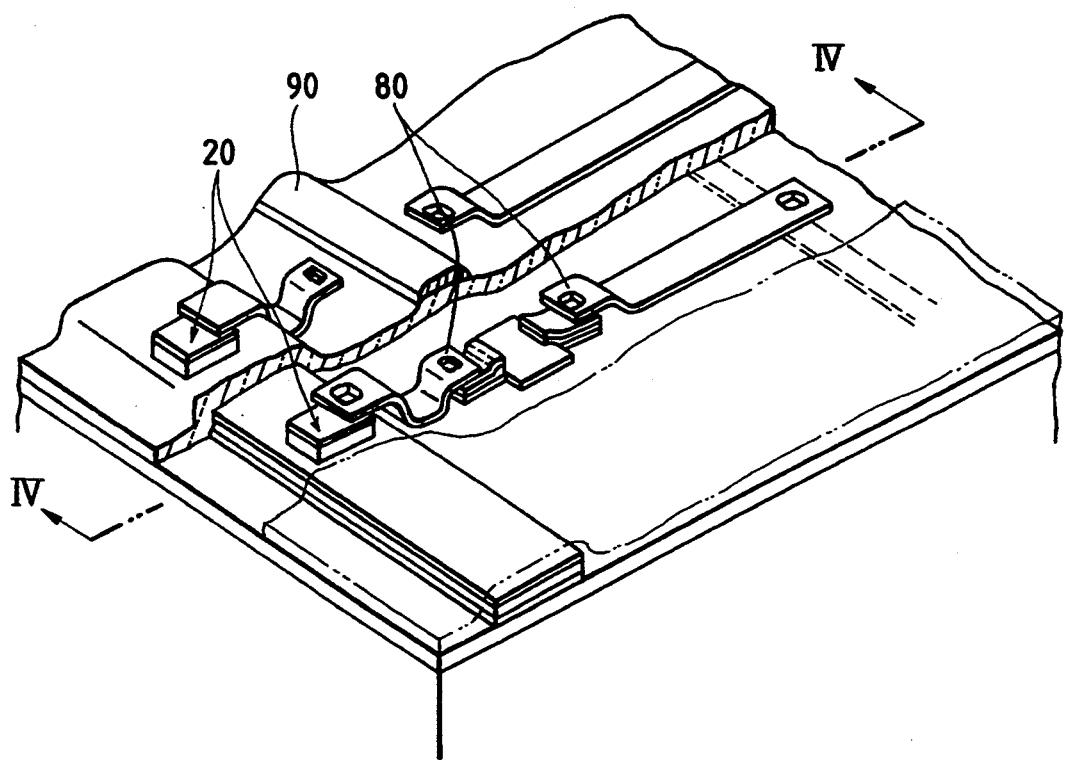
FIG. 3 is a perspective view of the image sensor.
Figure 4:
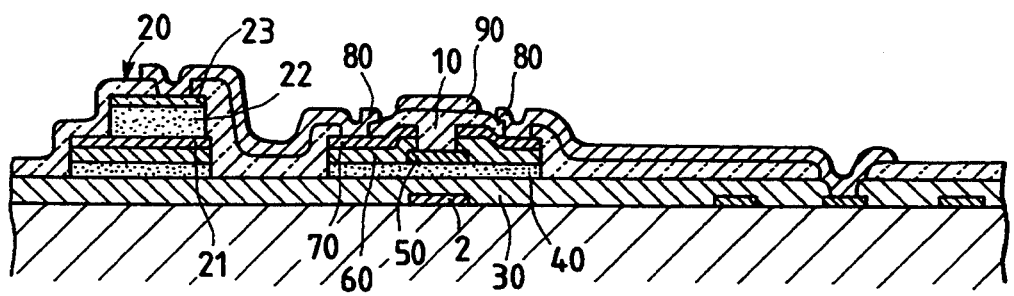
FIG. 4 is a cross sectional view taken on line IV—IV of FIG. 3.
Figure 5:
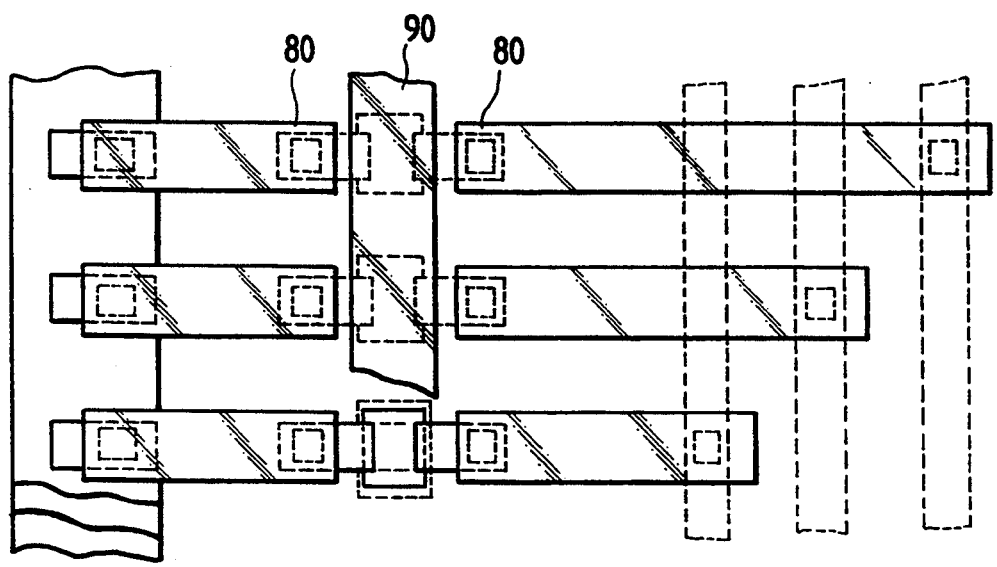
FIG. 5 is a plan view of the image sensor of FIG. 3.

As shown in FIGS. 3 and 4, the thin film transistor is connected to a photosensor 20 composed of a chromic electrode 21, a photoconductive layer 22, and a transparent electrode 23, and may be used for driving an image sensor.

Figure 6A:
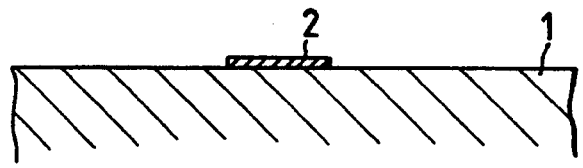
FIGS. 6(A) through (K) show diagrams for illustrating a fabrication process of the thin film transistor embodying the present invention.

Further, a preferred embodiment of the thin film transistor is fabricated by going through each of the following steps. First, as shown in FIG. 6(A), by a sputtering method and a photoetching method, the gate electrode 2, with a thickness of 500 Å, is deposited on a transparent glass substrate. The gate electrode 2 may also be formed of various materials, such as chromium (Cr), titanium (Ti), wolfram (W), molybdenum (Mo), nickel (Ni), copper (Cu), titanium nitride (TiN), titanium wolfram (TiW), tantalum (Ta), and so on. The transparent glass substrate may include various materials such as glass, quartz, ceramics, polyimide resin, or the like. Preferably, material available in commerce known as "CORNING 7059" may be used.

Figure 6B:
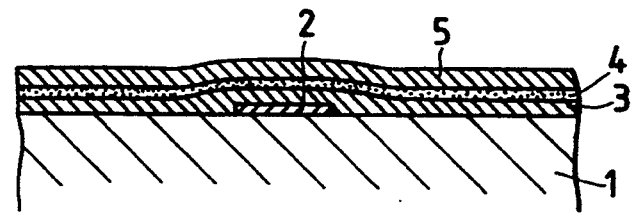

Thereafter, as shown in FIG. 6(B), in a vacuum condition utilizing a plasma-assisted CVD (chemical vapor deposition) method, an insulating coat 3 made of amorphous silicon nitride ($Si_3N_4$) with a thickness of 3000 Å, a semiconductor coat 4 made of amorphous silicon (a-Si), with a thickness of 1000 Å and used for forming the first amorphous semiconductor layer, and a protection coat 5 made of amorphous silicon nitride ($Si_3N_4$) with a thickness of 1500 Å, and used for forming the protecting film, are serially deposited thereon. The insulating coat 3 may also be silicon oxide or other conventionally used materials. Further, as material composing the semiconductor, amorphous silicon, polysilicon, cadmium selenium (CdSe), or the like may also be employed.

Figure 6C:
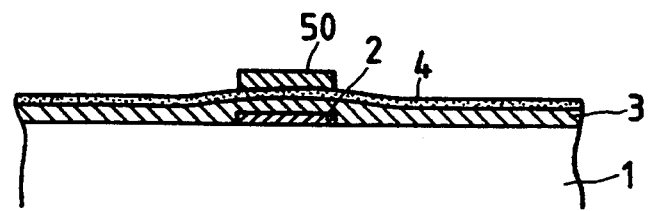

Next, without using a vacuum condition, a photoresist film (not shown) (a positive resist material, such as OFPR-8000, manufactured by Tokyo Ohka Corporation) is uniformly coated on the protecting coat 5 by a spin coater, and further a patterning exposure using ultraviolet light is performed thereon through a glass mask (not shown) by a demagnifying projection stepper (not shown). The patterning exposure changes the irradiated portion of the photoresist film into a portion that can be dissolved by a developer. Thereafter, the irradiated portion is dissolved by a developer (a nonmetal developer, such as NMD-3, manufactured by Tokyo Ohka Corporation) and removed so that a resist film (not shown) having a shape like the exposure pattern is formed. The exposed protecting coat 5 is then dissolved and removed by performing an RIE method using, for example, $SF_6$+ freon 115 or $CCl_4$ gas. The resist film is removed to uncover the protecting film 50 as shown in FIG. 6(C).

Figure 6D:
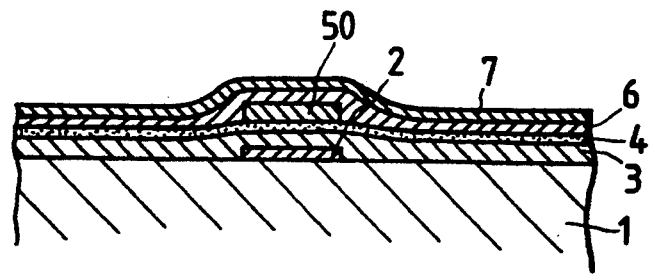

Subsequently, a grease removing process and a cleaning process are performed on the surface of the substrate 1 on which this protecting film 50 is formed, and further the substrate is introduced to a chamber filled with nitrogen gas to be used for CVD processing. After the pressure is reduced until this chamber is evacuated, a second amorphous semiconductor layer forming film 6, with a thickness of 1000 Å, made of $n^+$ amorphous silicon mixed with quintvalent P (phosphorous) atoms, and a diffusion preventing layer forming film 7, with a thickness of 1500 Å, made of chromium are serially deposited thereon (see FIG. 6(D)).

The second amorphous semiconductor layer forming film 6 may also be made of amorphous silicon or the like mixed with trivalent or quintvalent atoms. Trivalent atoms such as gallium (Ga), boron (B), indium (In), aluminum (Al) and so on may be used, or quintvalent atoms of phosphorous (P), antimony (Sb), arsenic (As), and so on may be used. Preferably, the second amorphous semiconductor layer forming film 6 is made on the amorphous silicon semiconductor coat 4 by a mixed gas composed of phosphine ($PH_3$) and silane ($SiH_4$) gases. Further, materials composing the diffusion preventing layer forming film may be, in addition to chrome (Cr), such materials as titanium (Ti), wolfram (W), molybdenum (Mo), tantalum (Ta) and so on.

Figure 6E:
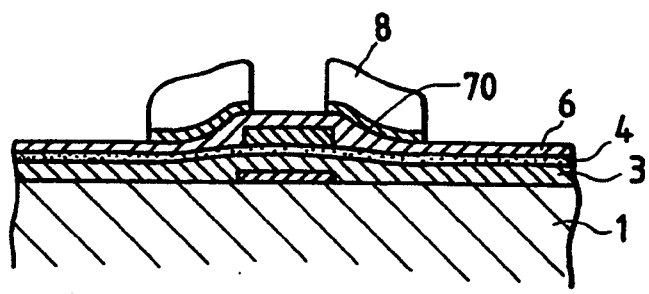

Thereafter, as shown in FIG. 6(E), without using a vacuum condition, a resist film 8 is formed like the exposure pattern by a similar process to that previously described. Further, etching processing is performed thereon by using etching chemicals composed of a mixture of cerium (II) ammonium nitrate and perchloric acid to remove the part of the diffusion preventing layer forming film 7 not covered by the resist film 8, thereby forming the diffusion preventing layer 70. With the resist film 8 being left, etching processing is performed thereon by using etching chemicals composed of fluoric acid compounds to remove the second amorphous semiconductor layer forming film 6 and the semiconductor coat 4 made of amorphous silicon which are not covered by the resist film 8. The resist film 8 is then removed.

Figure 6F:
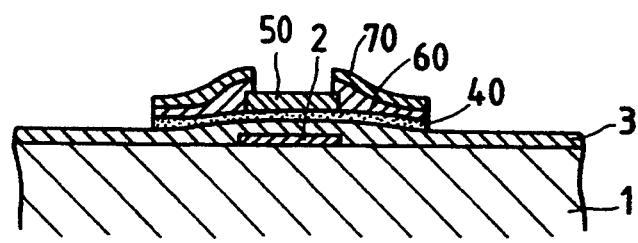
Figure 6G:
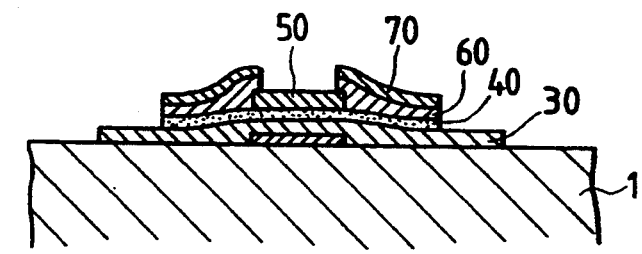
Figure 6H:
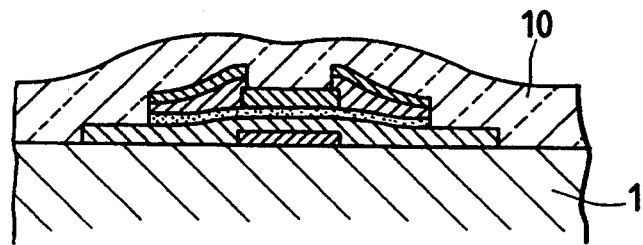
Figure 6I:
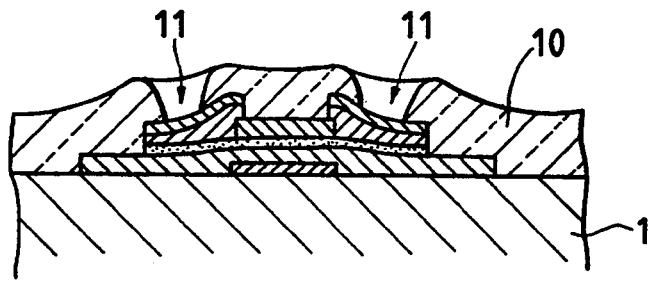

Thus, after the second amorphous semiconductor layer 60 and the first amorphous semiconductor layer 40 are formed as shown in FIG. 6(F), a gate insulating film 30 is formed in the shape of an exposure pattern by removing the insulating coat 3 (made of amorphous silicon nitride ($Si_3N_4$) as shown in FIG. 6(G)) using a conventional photoetching method. In addition, after a grease removing process and a cleaning process and so on are further performed on the surface of the substrate 1, a film of polyimide resin (manufactured by Hitachi Kasei Corporation and named PIX compound), with a thickness of 1 μm, is coated on the surface of the substrate by performing a roller coating method, a spin coating method and so on, as shown in FIG. 6(H) to form the insulating layer 10. The insulating layer 10 can be constructed of a macromolecular material such as silicon resin and so on, or by inorganic material such as silicon oxide, silicon nitride, and so on, in addition to the prefered polyimide resin. Further, as shown in FIG. 6(I), apertures 11 called "via holes" are provided by using a photoetching method.

Figure 6J:
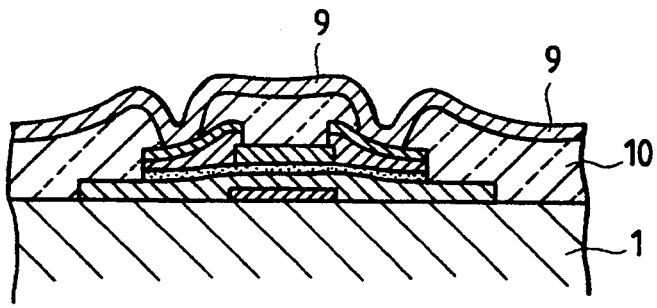

Next, as shown in FIG. 6(J), a layer made of aluminum 9, with a thickness of 1 μm, is uniformly deposited on the whole surface of the substrate 1 by performing a sputtering method and is used for forming the source and drain electrodes and the light intercepting layer. The layer made of aluminum 9 can also be formed by metals having good conductivity and light intercepting property such as chrome (Cr), titanium (Ti), wolfram (W), molybdenum (Mo), nickel (Ni), copper (Cu), titanium nitride (TiN), titanium wolfram (TiW), tantalum (Ta) and so on.

Figure 6K:
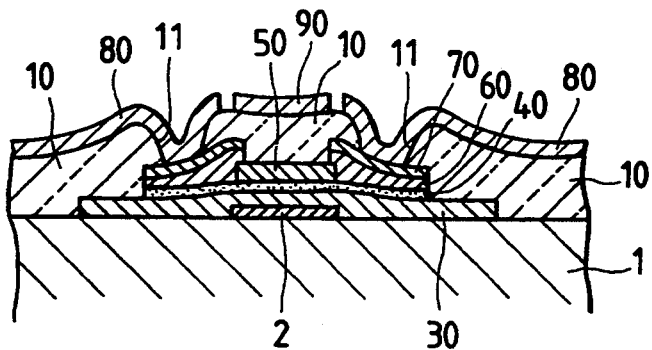
Figure 7:
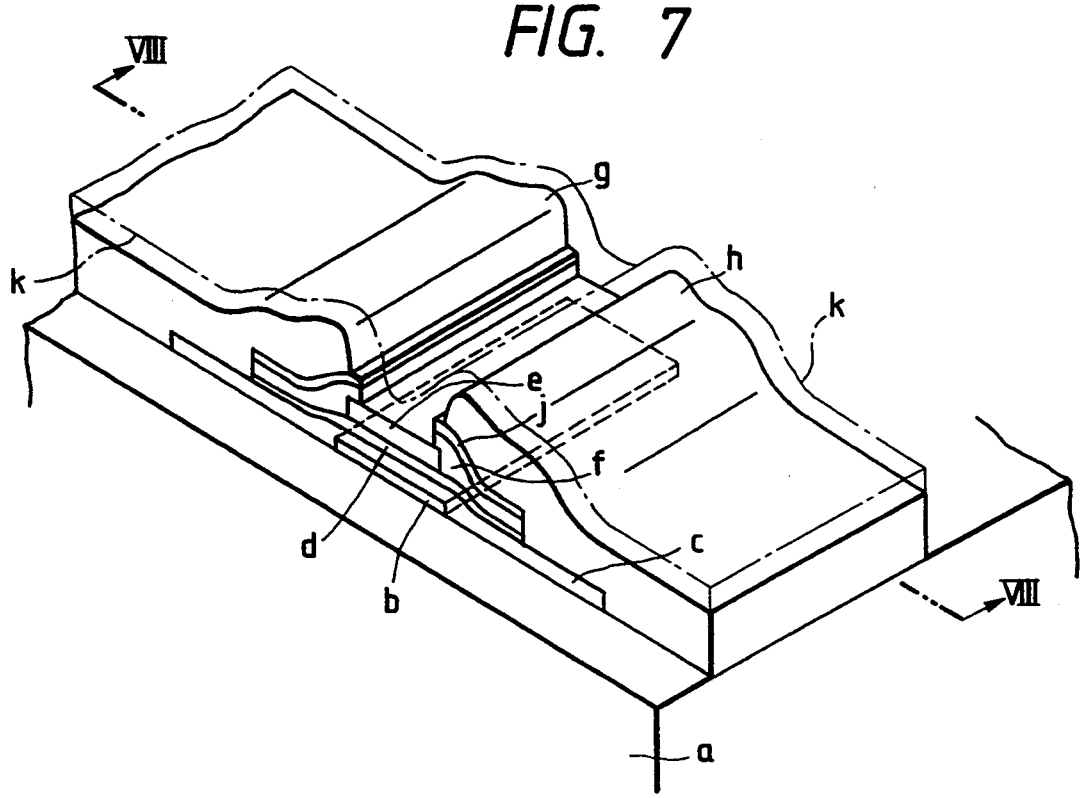
FIG. 7 is a perspective view of a conventional thin film transistor.
Figure 8:
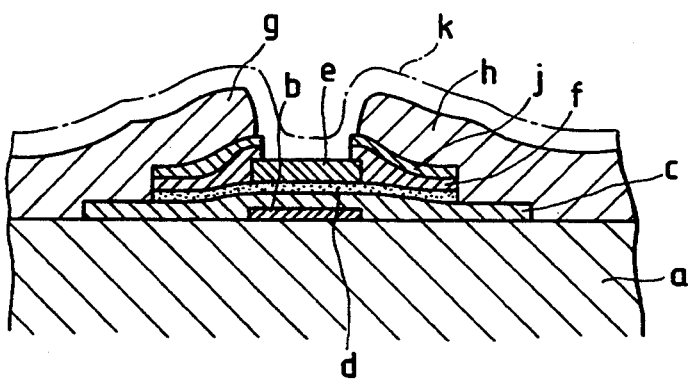
FIG. 8 is a cross sectional view taken on line VIII—VIII of FIG. 7.

Further, by using a conventional photoetching method such as wet etching or dry etching or others widely known in the art, the source and drain electrodes 80 and the light intercepting layer 90 are formed by selectively removing the aluminum layer 9. Thus, as shown in FIG. 6(K), the source and drain electrodes 80 and the diffusion preventing layer 70 are connected to each other through the apertures 11, whereby a thin film transistor is provided with the light intercepting layer 90.

The light intercepting layer 90 is grounded at one end thereof such that static electricity is not stored therein. This is because the light intercepting layer is insulated by the insulating layer which may cause undesirable static electricity to be stored in the light intercepting layer. A channel may be formed by the static electricity in the semiconductor layer and thus the transistor may be detrimentally affected. It is also preferable that a wiring portion for grounding the light intercepting layer 90 and for interconnecting the source and drain electrodes 80 are formed in the same fabrication step as the light intercepting layer 90. Further, when fabricating this thin film transistor, it is preferable that a process for fabricating a photosensor 2 is simultaneously performed.

The thin film transistor fabricated by the fabrication method embodying the present invention has the advantages that the incidence of light on the first amorphous semiconductor layer 40 can be prevented because the light intercepting layer 90 is made of aluminum and that no malfunction of the transistor attended by the incidence of light can occur.

Furthermore, the thin film transistor has another advantage that the number of steps of a fabrication method can be reduced and thus the fabrication can be simplified in comparison with the conventional method because the aluminum layer is selectively removed by a photoetching method into the desired form to simultaneously form the source and drain electrodes 80.

The present invention can prevent the incident of light on the semiconductor layer because the light intercepting layer is formed with a metal layer and also can reduce the number of fabrication steps because in the metal removing step, the source and drain electrodes and the light intercepting layer are formed by partially removing the metal layer.

Thus, the present invention has effects that a thin film transistor can be easily fabricated in which no malfunction can be attended by the incidence of light on the semiconductor layer.

Additional advantages and modification will readily occur to those skilled in the art. The invention in its broader aspects is therefore not limited to the specific details, representative structures, and illustrative examples shown and described herein. Accordingly, departures may be made from such details without departing from the spirit or scope of the general inventive concepts disclosed hereby.

What is claimed is:

1. A thin film transistor comprising:
   a gate electrode of electrically conductive material and having a width;
   a semiconducting material;
   a gate insulating material between said gate electrode and said semiconducting material;
   a source electrode layer;
   a drain electrode layer;
   a light intercepting layer having a width at least equal to the width of said gate electrode for preventing the incidence of light on a channel region of said semiconducting material substantially coextensive with the width of said gate electrode, wherein said light intercepting layer, said source electrode layer, and said drain electrode layer comprise layer portions of a single layer of electrically conductive material; and
   an electrode insulating layer adjacent to said source electrode layer, said drain electrode layer and said light intercepting layer, said electrode insulating layer including apertures for allowing said source electrode layer and said drain electrode layer to make electrical contact with said semiconductor material.

2. The thin film transistor as defined by claim 1, wherein said semiconductor material comprises a first layer and a second layer, said second layer comprising amorphous silicon mixed with trivalent atoms.

3. The thin film transistor as defined by claim 2, wherein said first layer of semiconducting material has an approximate thickness of 1000 angstroms.

4. The thin film transistor as defined by claim 2, wherein said second layer of amorphous silicon has an approximate thickness of 1000 angstroms.

5. The thin film transistor as defined by claim 1, further comprising a protecting film adjacent to said semiconducting material.

6. The thin film transistor as defined by claim 1, wherein said light intercepting layer is held at a ground voltage potential for reducing static charge thereon.

7. The thin film transistor as defined by claim 1, further comprising a diffusion preventing layer adjacent to said semiconducting material.

8. The thin film transistor as defined by claim 7, wherein said diffusion preventing layer is made of chromium and has an approximate thickness of 1500 angstroms.

9. The thin film transistor as defined by claim 1, further comprising a photosensor.

10. The thin film transistor as defined by claim 9, wherein said photosensor comprises a chromium electrode, a photoconductive layer, and a transparent electrode.

11. The thin film transistor as defined by claim 1, wherein said drain electrode layer, said source electrode layer, and said light intercepting layer are made of aluminum and have an approximate thickness of 1 micrometer.

12. The thin film transistor as defined by claim 1, wherein said semiconductor material comprises a first layer and a second layer, said second layer comprising amorphous silicon mixed with quintvalent atoms.

13. The thin film transistor as defined by claim 12, wherein said first layer of semiconducting material has an approximate thickness of 1000 angstroms.

14. The thin film transistor as defined by claim 12, wherein said second layer of amorphous silicon has an approximate thickness of 1000 angstroms.

* * * * *